(12) United States Patent
Hofrichter

(10) Patent No.: US 10,886,249 B2
(45) Date of Patent: Jan. 5, 2021

(54) HYBRID WAFER-TO-WAFER BONDING AND METHODS OF SURFACE PREPARATION FOR WAFERS COMPRISING AN ALUMINUM METALIZATION

(71) Applicant: ams International AG, Jona (CH)

(72) Inventor: Jens Hofrichter, Gattikon (CH)

(73) Assignee: ams International AG, Jona (CH)

( * ) Notice: Subject to any disclaimer, the term of this patent is extended or adjusted under 35 U.S.C. 154(b) by 0 days.

(21) Appl. No.: 15/966,206

(22) Filed: Apr. 30, 2018

(65) Prior Publication Data

US 2019/0237429 A1 Aug. 1, 2019

Related U.S. Application Data

(60) Provisional application No. 62/624,246, filed on Jan. 31, 2018.

(51) Int. Cl.
*H01L 21/46* (2006.01)
*H01L 23/00* (2006.01)
(Continued)

(52) U.S. Cl.
CPC .............. *H01L 24/80* (2013.01); *C23C 22/34* (2013.01); *C23C 22/78* (2013.01); *H01L 24/05* (2013.01); *H01L 24/06* (2013.01); *H01L 24/08* (2013.01); *H01L 24/09* (2013.01); *H01L 24/29* (2013.01); *H01L 24/32* (2013.01); *H01L 24/83* (2013.01);
(Continued)

(58) Field of Classification Search
CPC ......... H01L 24/80; H01L 24/94; H01L 25/50; H01L 24/83; H01L 24/09; H01L 24/32; H01L 24/08; H01L 24/29; H01L 24/05; H01L 24/06; H01L 2224/08146; H01L 2224/83896; H01L 2224/09517; H01L 2224/29186; H01L 2224/8001; H01L 2224/32145; H01L 2224/80001; H01L 2224/8002; H01L 27/1469; H01L 2224/06505; H01L 2224/0557; H01L 2224/05624; H01L 2224/05688; H01L 2224/05647; H01L 2224/80895; H01L 2224/80896; H01L 2224/80905;
(Continued)

(56) References Cited

U.S. PATENT DOCUMENTS 2,075,370 A 3/1937 Strathmeyer
4,087,367 A 5/1978 Rioult et al.
(Continued)

FOREIGN PATENT DOCUMENTS

EP 1870489 12/2007

OTHER PUBLICATIONS

Rebhan, B. et al., "Low-temperature Aluminum-Aluminum wafer bonding", *ECS Transactions* 75(9):15-24 (2016).

*Primary Examiner* — Robert G Bachner
(74) *Attorney, Agent, or Firm* — Michael Best and Friedrich LLP

(57) ABSTRACT

A surface treatment solution includes a fluoride source; a first solvent; and a water transforming agent to transform water produced during wafer surface treatment into a second solvent, which can be the same as, or different from, the first solvent. The solution can be used, for example, in surface preparation for wafers having a backend including an electrical interconnect that includes aluminum or an aluminum alloy.

40 Claims, 3 Drawing Sheets

(51) Int. Cl.
*C23C 22/78* (2006.01)
*C23C 22/34* (2006.01)
*H01L 25/00* (2006.01)
*H01L 27/146* (2006.01)

(52) U.S. Cl.
CPC .............. *H01L 24/94* (2013.01); *H01L 25/50* (2013.01); *H01L 27/1469* (2013.01); *H01L 2224/0557* (2013.01); *H01L 2224/05624* (2013.01); *H01L 2224/05647* (2013.01); *H01L 2224/05688* (2013.01); *H01L 2224/06505* (2013.01); *H01L 2224/08146* (2013.01); *H01L 2224/09517* (2013.01); *H01L 2224/29186* (2013.01); *H01L 2224/32145* (2013.01); *H01L 2224/80001* (2013.01); *H01L 2224/8001* (2013.01); *H01L 2224/8002* (2013.01); *H01L 2224/80011* (2013.01); *H01L 2224/80895* (2013.01); *H01L 2224/80896* (2013.01); *H01L 2224/80905* (2013.01); *H01L 2224/83896* (2013.01)

(58) Field of Classification Search
CPC ........... H01L 2224/80011; C23C 22/78; C23C 22/34; C23C 22/02; C23G 1/125
See application file for complete search history.

(56) References Cited

U.S. PATENT DOCUMENTS

| | | | |
|---|---|---|---|
| 4,230,523 A | 10/1980 | Gajda | |
| 5,868,872 A | 2/1999 | Karmaschek et al. | |
| 6,265,309 B1* | 7/2001 | Gotoh | C11D 3/044 |
| | | | 134/1.3 |
| 6,962,835 B2 | 11/2005 | Tong et al. | |
| 7,030,034 B2 | 4/2006 | Fucsko et al. | |
| 7,252,718 B2 | 8/2007 | Carter | |
| 8,802,538 B1 | 8/2014 | Liu et al. | |
| 2002/0037820 A1* | 3/2002 | Small | C09K 13/08 |
| | | | 510/175 |
| 2010/0043823 A1* | 2/2010 | Lee | H01L 21/31111 |
| | | | 134/1.3 |
| 2016/0086899 A1 | 3/2016 | Tong et al. | |

* cited by examiner

HYBRID WAFER-TO-WAFER BONDING AND METHODS OF SURFACE PREPARATION FOR WAFERS COMPRISING AN ALUMINUM METALIZATION

CROSS-REFERENCE TO RELATED APPLICATION(S)

This application claims the benefit of priority of U.S. Provisional Patent Application No. 62/624,246, filed on Jan. 31, 2018, the contents of which are incorporated herein by reference in their entirety.

FIELD OF THE DISCLOSURE

The present disclosure relates to hybrid wafer-to-wafer bonding and methods of surface preparation for wafers comprising an aluminum metallization.

BACKGROUND

Fusion bonding refers to a wafer bonding process without additional intermediate layers providing electrical contact. The bonding process is based on chemical bonds between the surfaces of the materials to be bonded, and generally require that the wafer surfaces be sufficiently clean, flat and smooth so as to avoid the occurrence of voids or interface bubbles.

In wafer-to-wafer bonding with an aluminum back-end, the mechanical and the electrical parameters of the bond may be inferior, for example, to copper-based bonds, because aluminum oxidizes at ambient conditions thereby forming alumina ($Al_2O_3$), which is an excellent electrical isolator, and is mechanically and chemically stable.

It would be desirable to remove or transform alumina chemically in a manner that: (i) is highly selective with respect to aluminum and aluminum-based alloys, as well as silica (silicon dioxide), (ii) is fully CMOS compatible without introducing metallic contaminants, and (iii) eliminates the need for high-temperature, high-pressure based bonding methods used to mechanically remove the alumina interfacial layer.

SUMMARY

The present disclosure describes wafer surface preparation techniques as well as techniques for wafer-to-wafer bonding using wafers having an aluminum (or aluminum alloy) back-end.

For example, in one aspect, the disclosure describes a surface treatment solution that includes a fluoride source; a first solvent; and a water transforming agent to transform water produced during wafer surface treatment into a second solvent. The second solvent can be the same as, or different from, the first solvent.

The solution can be used, for example, in surface preparation for wafers having a backend including an electrical interconnect comprising aluminum or an aluminum alloy. For example, the present disclosure describes a method that includes providing a wafer having a backend comprising an electrical interconnect that includes aluminum or an aluminum alloy. The method includes removing an oxide of the aluminum or aluminum alloy from the electrical interconnect using a surface treatment solution. The surface treatment solution includes a fluoride source, a first solvent, and a water transforming agent to transform water produced during the wafer surface treatment into a second solvent.

In another aspect, the disclosure describes a method includes providing first and second wafers each of which has a backend comprising an electrical interconnect, of which at least one of the wafers has a backend comprising aluminum or an aluminum alloy, removing an oxide of the aluminum or aluminum alloy from one or more of the electrical interconnects using a surface treatment solution, and subsequently bonding together the backends of the first and second wafer. The surface treatment solution includes a fluoride source, a first solvent, and a water transforming agent to transform water produced during wafer surface treatment into a second solvent.

The surface treatment solution also can be used in other applications.

Some implementations include one or more of the following features. For example, in some instances, the fluoride source includes ammonium fluoride ($NH_4F$) or ammonium bifluoride ($NH_4HF_2$). In some cases, the water transforming agent includes an acetate such as methyl acetate or ethyl acetate.

In some implementations, the surface treatment agent solution forms an electrically conductive passivation layer on the wafer.

In some implementations, the surface treatment solution includes water at a concentration of less than 10%, at a concentration of less than 1%, or at a concentration of less than 0.1%.

The technology can be used, for example, in the three-dimensional (3D) integration of wafers such as wafer-to-wafer bonding, as well as 3D or 2.5D integration of die-to-wafer bonding of components having, at least partially, an aluminum metallization. Such wafer-to-wafer bonding may be used, for example, for any application in which different sensor wafers and electronic wafers need to be bonded. Thus, the techniques can be used in hybrid bonding of wafers. In some applications, a first wafer includes photodiodes or other sensors (e.g., consumer, industrial or medical) and a second wafer includes corresponding read-out electronic circuit. Examples of applications, in which the present technique can be applied include, but are not limited to, imaging sensors, MEMS microphones, gas sensors and infrared (IR)-sensors.

By using the disclosed wafer-to-wafer bonding technique, sensor wafers and electronic wafers can be merged, thereby combining the advantages of reducing the need for monolithic integration on a single substrate and the associated cost and time for the process qualification.

In some implementations, the techniques include one or more of the following advantages. For example, some implementations can achieve avoidance of high-temperature and high-pressure bonding methods, avoidance of ultra-high vacuum tools for physical alumina removal, and/or avoidance of the need for standard CMOS materials.

Other aspects, features and advantages will be readily apparent form the following detailed description, the accompanying drawings and the claims.

DETAILED DESCRIPTION

In accordance with the present disclosure, a wet clean process can remove the aluminum oxide while leaving intact both the surrounding silica as well as the underlying aluminum (or aluminum alloy, e.g., AlCu or AlSiCu). To prevent silica to be etched, it is desirable to: (1) have a non-aqueous solution with a low pH-value, and (2) use an acetate to transform water resulting from the chemical reaction into a solvent (e.g., to an alcohol) and a weak acid to prevent the formation of hydrofluoric acid (HF).

The techniques described here use a novel etchant chemistry supporting excellent etch selectivity towards silica and aluminum. Selectivity can be leveraged by including a water transforming agent to transform water produced during wafer surface treatment into a solvent.

Figure 1:
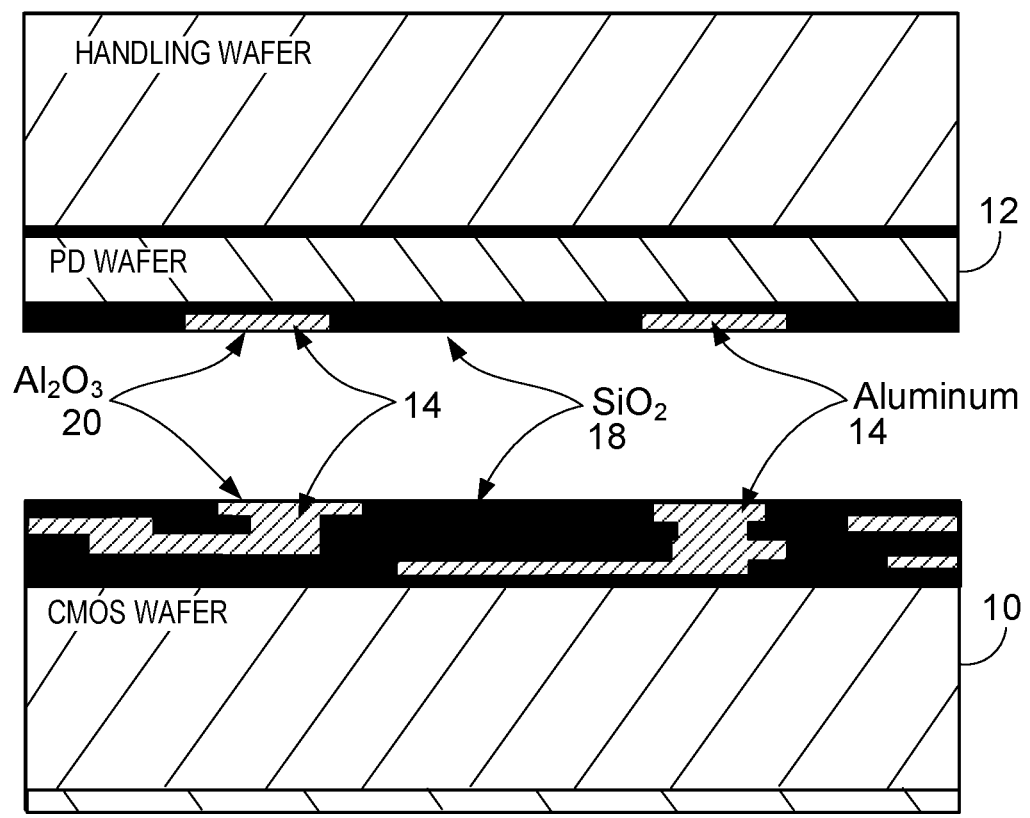
FIG. 1 illustrates wafers, prior to bonding, on which an oxide layer is present on the aluminum interconnections.
Figure 2:
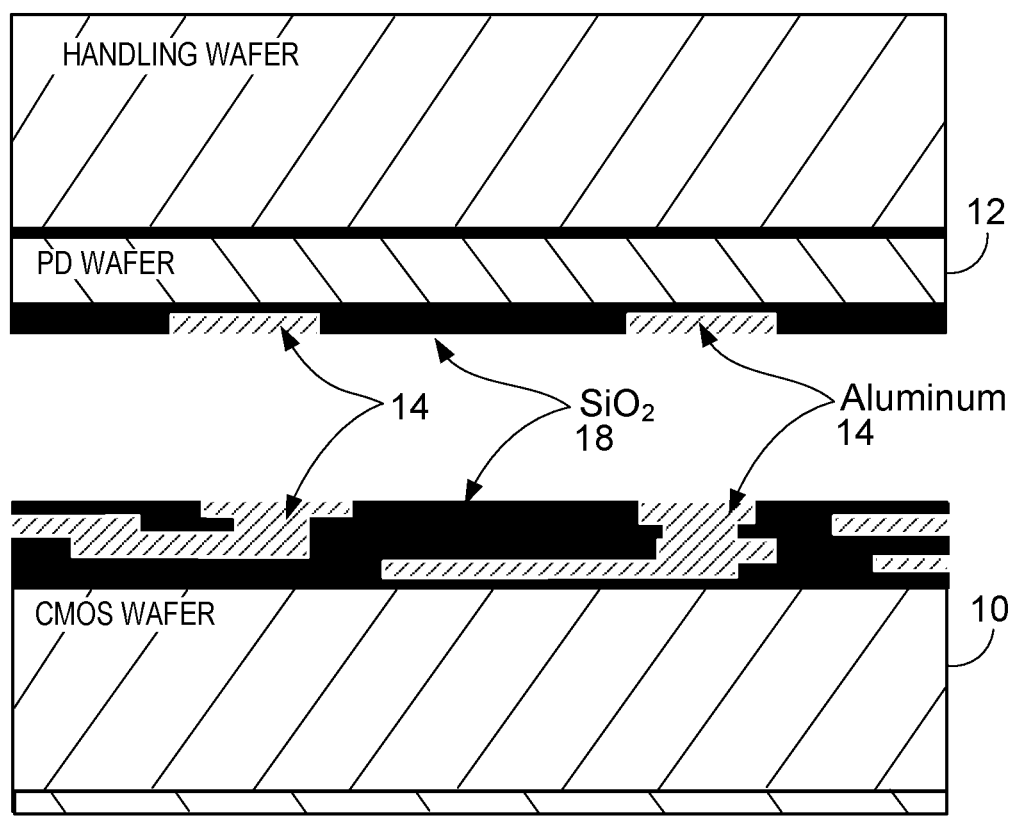
FIG. 2 illustrates the wafers after removal of the oxide layer(s) on the aluminum interconnections.
Figure 3:
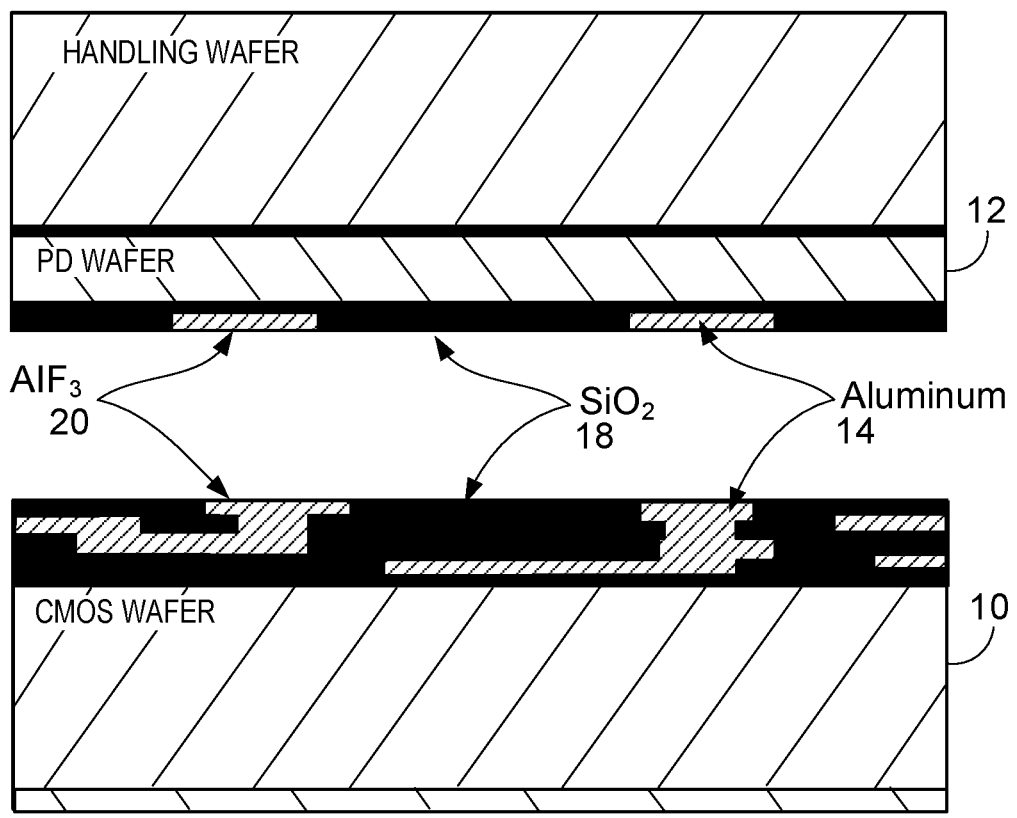
FIG. 3 illustrates the wafers after removal of the oxide layer(s) and formation of an electrically conductive passivation layer on the aluminum interconnections.

As illustrated in FIGS. 1-3, an example implementation uses two silicon (Si) wafers 10, 12 having a CMOS front-end-of-line and a CMOS back-end-of-line without passivation layers by means of silicon nitride or polyimide. In some instances, one or both of the wafers may not have a CMOS front-end-of-line. The back-end of each wafer 10, 12 includes respective electrical interconnections 14 that are composed of aluminum or an aluminum alloy (e.g., AlCu or AlSiCu). Such electrical interconnections 14 can include electrically conductive pads, vias, or other interconnections. In the illustrated structure, the aluminum interconnect and the silica are side-by-side at the wafer surface. Oxide layers may form on the surfaces of the wafers. For example, as shown in FIG. 1, a silicon dioxide layer 18 may form on the silicon surfaces, and an alumina ($Al_2O_3$) layer 20 may be located on top of the aluminum or aluminum alloy surfaces.

In some instances, after finalizing the last metallization level, a chemical-mechanical polishing (CMP) step is carried out to planarize the surface and smooth the oxide layer. In some instances, additional oxide deposition and CMP steps may be performed until the desired planarization and roughness values are obtained. In some implementations, the surface roughness of a 2 μm×2 μm atomic force microscopy (AFM) scan field is smaller than 0.5 nm RMS. The topography can, in some instances, be better than 10 nm over 10 μm×10 μm (i.e., there are no steps larger than 10 nm visible in the scan field). In some cases, the aluminum surface may be oxidized by using, e.g., an oxygen plasma, to form a defined alumina thickness, and to produce a defined pad recess during the successive etch.

After CMP and metrology, both wafers can be subjected to a wet-chemical surface treatment to remove the aluminum alloy's oxide (i.e., the alumina) as illustrated in FIG. 2. The native or other oxide of the aluminum or aluminum alloy can be removed from the electrical interconnect using a surface treatment solution that includes a fluoride source, a first solvent, and a water transforming agent to transform water produced during wafer surface treatment into a second solvent. The second solvent may be the same as, or different from, the first solvent.

In some instances, the surface treatment solution comprises a fluoride source to remove the alumina, as well as to form a passivation layer by transforming the alumina ($Al_2O_3$) to aluminum fluoride ($AlF_3$), which may be electrically conductive. FIG. 3 shows examples of the $AlF_3$ passivation layer 22 formed on the aluminum (or aluminum alloy) layers 14. For instance, in some instances, the fluoride source is $NH_4F$. Using this particular fluoride source, the chemical equation reads (1):

$$Al_2O_3 + 6NH_4F \rightarrow 2AlF_3 + 3H_2O + 6NH_3 \quad (1)$$

In some instances, the fluoride source includes ammonium bifluoride ($NH_4HF_2$). The techniques can include inhibiting the surface oxidation process by an appropriate fluoride concentration (e.g., NH4F or an organic ammonium fluoride salt) and an ammine.

Preferably, the surface treatment solution is not aqueous because an aqueous etchant can form HF, which attacks the surrounding silica and aluminum films. In some implementations, the surface treatment solution includes water at a concentration of less than 10%, less than 1%, or less than 0.1%. The surface treatment solution includes a water consuming agent, as well as the corresponding solvent, such as an alcohol, for instance, to support the solubility of the fluoride source. Thus, in some cases, the surface treatment solution includes an alcohol (e.g., methanol, ethanol, isopropanol). Alternatively, glycerine, glycerol, ethylene glycol, polyols or other solvents may be used. By using a polar solvent, free water and hydrogen molecules are bound, thereby reducing the formation of HF. Moreover, pure acetic acid may be added when using an aqueous solution to inhibit the formation of HF.

Instead of binding water molecules electrostatically, it can be more efficient to consume the aqueous reaction products fully by transforming an acetate to a weak acid and an alcohol. Equation (2) provides an example of transforming methyl acetate by consuming water to acetic acid and methanol.

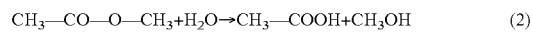

$$CH_3\text{—}CO\text{—}O\text{—}CH_3 + H_2O \rightarrow CH_3\text{—}COOH + CH_3OH \quad (2)$$

Other acetates, such as ethyl actetate, may be used to form acetic acid and ethanol. Also, other chemicals may be used to consume water at a molecular level, rather than binding it electrostatically. Methylformate, water-producing formic acid and methanol are other options.

The surface cleaning- and treatment process may be incorporated rapidly into the bonding tool (e.g., a cluster tool). After surface treatment, the wafers may be spun dry or rinsed with deionized (DI) water. Shortly after that, the wafers can be bonded (e.g., preferably prior to re-oxidation of the aluminum and aluminum fluoride surfaces). Bonding, in some cases, is performed at room temperature (e.g., about 27° C.) and without mechanical pressure. However, mechanical pressure and elevated temperatures may be used subsequently to improve the bonding strength, and may be performed in a furnace as part of a batch process. In some instances, bonding the wafers is performed preferably at a temperature below 350° C. and with an applied force of less than 50 kN for a 8-inch wafer.

The techniques described here can be used to bond together wafers for purposes other than used described above.

Various modifications can be made within the spirit of this disclosure. Thus, other implementations will be apparent and are within the scope of the claims.

What is claimed is:

1. A surface treatment solution comprising:
    a fluoride source;
    a first solvent; and
    a water transforming agent to transform, into a second solvent, water produced during wafer surface treatment;
    wherein the surface treatment solution includes water at a concentration of less than 10%.

2. The surface treatment solution of claim 1 wherein the water transforming agent is an acetate.

3. The surface treatment solution of claim 2 wherein the acetate is methyl acetate.

4. The surface treatment solution of claim 2 wherein the acetate is ethyl acetate.

5. The surface treatment solution of claim 1 wherein the fluoride source comprises ammonium fluoride (NH4F).

6. The surface treatment solution of claim 1 wherein the fluoride source comprises ammonium bifluoride (NH4HF2).

7. The surface treatment solution of claim 1 wherein the surface treatment solution includes water at a concentration of less than 1%.

8. The surface treatment solution of claim 7 wherein the surface treatment solution includes water at a concentration of less than 0.1%.

9. The surface treatment solution of claim 1 wherein the second solvent is different from the first solvent.

10. The surface treatment solution of claim 1 wherein the second solvent is the same as the first solvent.

11. The method of claim 1 wherein the surface treatment agent solution forms an electrically conductive passivation layer on the wafer.

12. The surface treatment solution of claim 1, wherein the surface treatment solution is a non-aqueous solution.

13. A method comprising:
providing a wafer having a backend comprising an electrical interconnect that comprises aluminum or an aluminum alloy; and
removing an oxide of the aluminum or aluminum alloy from the electrical interconnect using a surface treatment solution that comprises:
a fluoride source;
a first solvent; and
a water transforming agent to transform, into a second solvent, water produced during wafer surface treatment;
wherein the surface treatment solution includes water at a concentration of less than 10%.

14. The method of claim 13 wherein the water transforming agent is an acetate.

15. The method of claim 14 wherein the acetate is methyl acetate.

16. The method of claim 14 wherein the acetate is ethyl acetate.

17. The method of claim 13 wherein the fluoride source comprises ammonium fluoride (NH4F).

18. The method of claim 13 wherein the fluoride source comprises ammonium bifluoride (NH4HF2).

19. The method of claim 13 further including planarizing or polishing the wafer prior to removing the oxide.

20. The method of claim 13 wherein the surface treatment solution includes water at a concentration of less than 1%.

21. The method of claim 20 wherein the surface treatment solution includes water at a concentration of less than 0.1%.

22. The method of claim 13 wherein the second solvent is different from the first solvent.

23. The method of claim 13 wherein the second solvent is the same as the first solvent.

24. The method of claim 13 wherein the electrical interconnect comprises aluminum.

25. The method of claim 13 wherein the electrical interconnect comprises AlCu.

26. The method of claim 13 wherein the electrical interconnect comprises AlSiCu.

27. The method of claim 13 wherein the electrical interconnect includes a pad.

28. The method of claim 13 wherein the electrical interconnect includes a via.

29. A method comprising:
providing first and second wafers each of which has a backend comprising an electrical interconnect, at least one of the wafers having a backend that comprises aluminum or an aluminum alloy;
removing an oxide of the aluminum or aluminum alloy from one or more of the electrical interconnects using a surface treatment solution that comprises:
a fluoride source;
a first solvent; and
a water transforming agent to transform water produced during wafer surface treatment into a second solvent; and
subsequently bonding together the first and second wafers with the treated surfaces facing each other;
wherein the surface treatment solution includes water at a concentration of less than 10%.

30. The method of claim 29 wherein the surface treatment solution includes water at a concentration of less than 1%.

31. The method of claim 30 wherein the surface treatment solution includes water at a concentration of less than 0.1%.

32. The method of claim 29 wherein the second solvent is different from the first solvent.

33. The method of claim 29 wherein the second solvent is the same as the first solvent.

34. The method of claim 29 wherein the fluoride source includes ammonium fluoride (NH4F).

35. The method of claim 29 wherein the fluoride source includes ammonium bifluoride ($NH_4HF_2$).

36. The method of claim 29 wherein the water transforming agent is an acetate.

37. The method of claim 36 wherein the acetate is methyl acetate.

38. The method of claim 36 wherein the acetate is ethyl acetate.

39. The method of claim 29 further including planarizing or polishing at least one of the first or second wafers prior to removing the native oxide.

40. The method of claim 29 wherein the surface treatment agent solution forms an electrically conductive passivation layer on the wafer.

* * * * *